United States Patent
Chen et al.

(10) Patent No.: US 6,614,687 B2
(45) Date of Patent: Sep. 2, 2003

(54) CURRENT SOURCE COMPONENT WITH PROCESS TRACKING CHARACTERISTICS FOR COMPACT PROGRAMMED VT DISTRIBUTION OF FLASH EPROM

(75) Inventors: Ming-Shang Chen, Hsinchu (TW); Wenpin Lu, I-Lan (TW); Baw-Chyuan Lin, Yunlin (TW); Mam-Tsung Wang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/848,786

(22) Filed: May 3, 2001

(65) Prior Publication Data

US 2002/0163835 A1 Nov. 7, 2002

(51) Int. Cl.[7] .............................................. G11C 11/34
(52) U.S. Cl. .............................. 365/185.18; 365/185.26
(58) Field of Search ........................ 365/185.18, 185.26

(56) References Cited

U.S. PATENT DOCUMENTS

| | | | | |
|---|---|---|---|---|
| 3,599,013 A | * | 8/1971 | Cope | 307/229 |
| 5,218,571 A | | 6/1993 | Norris | 365/189.09 |
| 5,467,306 A | | 11/1995 | Kaya et al. | 365/185.2 |
| 6,141,253 A | * | 10/2000 | Lin | 365/185.28 |
| 6,166,955 A | * | 12/2000 | Lu et al. | 365/185.18 |

FOREIGN PATENT DOCUMENTS

| JP | 0027593 | * | 1/1990 | G11C/14/00 |
|---|---|---|---|---|

OTHER PUBLICATIONS

Betty Prince, "Semiconductor Memories", 1983, Wiley, 2$^{nd}$ edition pp. 102–104.*

* cited by examiner

*Primary Examiner*—M. Tran
(74) *Attorney, Agent, or Firm*—Beyer Weaver & Thomas, LLP

(57) ABSTRACT

A new structure and method with a process tracking current source component to program a flash EPROM memory is proposed. By applying a current source which varies not only with the process variation but also with the source bias of the cell being programmed, a self-convergent and high-efficiency programming can be achieved. This process tracking current source component provides less current for cells with higher erased Vt and larger current for cells with lower erased Vt.

A circuit for programming a floating gate transistor includes a current source component. The current source component couples in series between the floating gate transistor and an electrical sink during a programming interval. The current source component includes an electrical characteristic substantially matching the electrical characteristic of the floating gate transistor.

An integrated circuit memory module on a semiconductor substrate is disclosed. The integrated circuit memory module includes: an array of floating gate memory cells, decoders, and a plurality of current source components. The array of floating gate memory cells is arranged in M rows and N columns. The decoders couple to the M rows and N columns of memory cells to provide for reading and programming floating gate memory cells within a selected one of the M rows of the memory array. The plurality of current source components each couple in series between an electrical sink and a corresponding one of the floating gate memory cells within the selected one of the M rows during a programming interval. Each of the plurality of current source components includes an electrical characteristic substantially matching the electrical characteristic of the corresponding one of the floating gate memory cells to be programmed.

29 Claims, 7 Drawing Sheets

FIG. 7A FLOATING GATE

FIG. 7B SOURCE BIAS of MEMORY CELL

CURRENT SOURCE COMPONENT WITH PROCESS TRACKING CHARACTERISTICS FOR COMPACT PROGRAMMED VT DISTRIBUTION OF FLASH EPROM

BACKGROUND OF THE INVENTION

1. Field of Invention

The present invention relates to a non-volatile, integrated circuit memory array such as an electrically erasable, electrically programmable read-only memory (EEPROM) array. In particular, the invention relates to an improved method and apparatus for programming floating gate memory cells.

2. Description of the Related Art

For flash memory devices, a memory array consists of a row and column arrangement of memory cells where each memory cell includes a floating gate transistor. Programming of a cell may be accomplished by applying drain and gate bias on a cell with the source grounded or with a small source bias to inject electrons to the floating gate. Erasure may be accomplished by applying a negative voltage on the gate and positive bias on the source (or drain) with drain (or source) floating. Process dependent characteristics of EEPROM transistors, including channel width/length and oxide thickness, affect operating characteristics of the device during the programming cycle. These process dependent characteristics may exhibit themselves as variations in the electrical characteristics of memory cells fabricated from different wafers, on different dies within a wafer or between memory cells on a single die. Cells with short/wide channels, a.k.a. fast bit cells, usually program faster than cells with long/narrow channels, a.k.a. slow bit cells.

A number of problems with prior art EEPROM/EPROM devices may be traced to process dependent variations in the electrical characteristics of memory cells. These include a wide range of threshold voltage distributions within an array as well as increase in power consumption. Process dependent variations result in program and erasure speed which differs from cell to cell. This results in wide bandwidth $\Delta V_t$ of program voltages for fast and slow bit cells about a desired program voltage. This distribution is particularly undesirable when the cell being programmed is a multilevel cell (MLC). Unlike an ordinary memory cell in which one bit of information is stored, an MLC stores more than one bit of information. This capability requires a compact Vt distribution which is difficult to achieve using current programming techniques. To achieve such compact Vt distribution, bit-by-bit program verification is required for memory arrays which implement multilevel cells. The drawback of this method is that much longer programming time is consumed as compared to the single level cell system. Power consumption is also effected by process dependent variations of memory cells. Programming of memory cells may be accomplished by applying fixed drain/source bias and stepped/ramped gate bias to program cells. Variations in the electrical characteristics of memory cells result in programming current per cell, which may vary from 200uA–400uA, so that the power consumption cannot be well controlled.

Several methods have been proposed to reduce the threshold voltage distribution of programmed cells within a memory array. One prior method is to intentionally increase the passive resistance of the EEPROM cells source node. The drawback to this approach is that a passive resistance does not track process variations that effect EEPROM programming efficiency. Another prior art technique to narrow threshold voltage distribution after programming is to alternately program and erase cells in successively smaller steps. Each cell is then checked after each program step to see whether it is properly programmed. This technique requires additional time and circuitry.

Another prior art technique is disclosed in U.S. Pat. No. 5,218,571 entitled "EPROM Source Bias Circuit With Compensation For Processing Characteristics", issued June 1993. That patent discloses a process tracking circuit used to control the source bias of cells being programmed, so as to remove process dependent program voltage variations between memory arrays.

Figure 1:
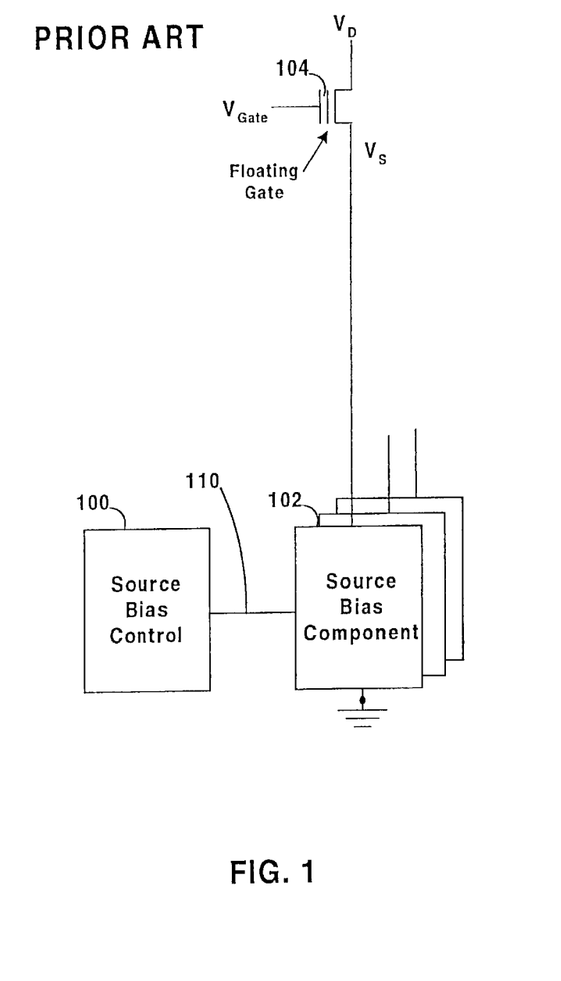
FIG. 1 shows a prior art circuit for reducing process dependent variations in program voltages between memory arrays.

FIG. 1 is a hardware block diagram of the '571 device. A representative EPROM transistor 104 of a memory array is shown. That cell is coupled to the current source component 102. There may be multiple current source components 102 within a memory array, all coupled to a common source bias control 100. The current source component includes one of the following devices: the parallel combination of an N-channel transistor and resistor, a voltage source or current source. Those devices are coupled in series between the floating gate 104 and a ground. The control gate of the device is coupled via signal line 110 to the source bias control which generates a process dependent voltage to drive the device. The process dependent voltage generated by the source bias control depends on the process variability of a single mirror cell within a mirror memory array contained within the source bias control 100. As the conductivity of the single mirror cell increases, the voltage on signal line 110 decreases. A decrease in the voltage on signal line 110 results in a reduction in the conductivity of the devices within the current source component. Therefore, the conductivity of the current source component(s) rises as the conductivity of the mirror memory cell decreases, and vice-versa. In chips/die with a high conductivity single mirror cell, the current source components coupled to the control will have lower conductivity and vice-versa. Thus, the voltage applied at the source of memory array is inversely related to the reference flash cell's resistance as expressed by the following equation 1:

$$V_S(\text{memory array}) \; 1/R\text{cell, where } R\text{cell is the channel resistance of reference flash cell.} \quad \text{Equation 1:}$$

There are several disadvantages to the prior art in approach. First, the circuitry disclosed in the '571 patent effects only inter-wafer/die process variations and not process variations between memory cells on a single chip/die. This results from the fact that there is only one process dependent element, i.e., the source bias control 100, per memory array. Second, process variability appears to require the mirroring of a significant portion of the memory array within the source bias control. Third, by increasing the source bias to memory array with primarily fast program bit cells, i.e., reducing Vds, the program current may be reduced and the time required to program these memory cells is increased.

What is needed is a programming technique which reduces the effect of process variations between wafers, between dies, and between memory cells on a chip without requiring an increase in programming time.

SUMMARY OF THE INVENTION

A new structure and method with a process tracking current source component to program a flash EPROM memory is proposed. By applying a process dependent current source component which exhibits process variations substantially matching those of the cell being programmed, a self-convergent and high efficiency programming can be achieved. This process tracking current source component provides less current for cells with higher erased Vt and larger current for cell with lower erased Vt.

In an embodiment of the invention, a circuit for programming a floating gate transistor is disclosed. The floating gate transistor includes: gate, drain and source nodes. The circuitry for programming includes a current source component. The current source component couples in series between the floating gate transistor and an electrical sink during a programming interval. The current source component includes an electrical characteristic substantially matching the electrical characteristic of the floating gate transistor.

In an embodiment of the invention an integrated circuit memory module on a semiconductor substrate is disclosed. The integrated circuit memory module includes: an array of floating gate memory cells, decoders, and a plurality of current source components. The array of floating gate memory cells is arranged in M rows and N columns. Each cell includes a floating gate transistor. The floating gate transistor includes: gate, drain and source nodes. The decoders couple to the M rows and N columns of memory cells to provide for reading and programming floating gate memory cells within a selected one of the M rows of the memory array. The plurality of current source components each couple in series between an electrical sink and a corresponding one of the floating gate memory cells within the selected one of the M rows during a programming interval. Each of the plurality of current source components includes an electrical characteristic substantially matching the electrical characteristic of the corresponding one of the floating gate memory cells to be programmed.

BRIEF DESCRIPTION OF THE DRAWINGS

These and other features and advantages of the present invention will become more apparent from the following detailed description of an example of array embodiment thereof, as illustrated in the accompanying drawings in which.

DETAILED DESCRIPTION OF THE EMBODIMENTS

A new structure and method with a process tracking current source component to program a flash EPROM memory is proposed. By applying a current source component with process dependent variations in its electrical characteristics during the programming of memory cells, a self-convergent and high efficiency programming can be achieved. This process tracking current source component provides less current for cells with higher erased Vt and larger current for cell with lower erased Vt. In an embodiment of the invention, the current source component includes a dummy cell in parallel with a resistor. The dummy cell device is designed to be sensitive to the process variations within the cells of a memory array. In another embodiment of the invention, programming involves the application of a fixed bias at the bit line and the word line voltage can be ramped or stepped as the source node is controlled by the current source component. This programming method is efficient and results in a compact programmed Vt distribution which is quite suitable for multilevel cell (MLC) application.

Figure 2:
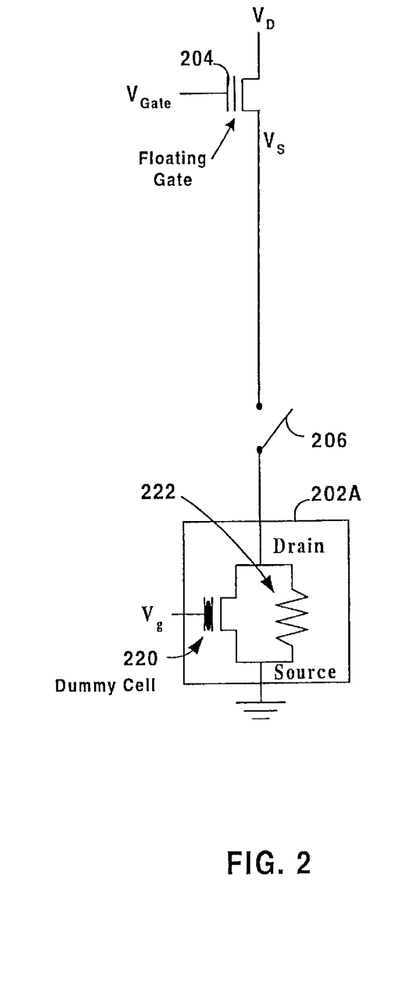
FIG. 2 is a hardware block diagram showing an embodiment of a source bias element according to the current invention for reducing process dependent threshold voltage distributions between the memory cells within a memory array.
Figure 3:
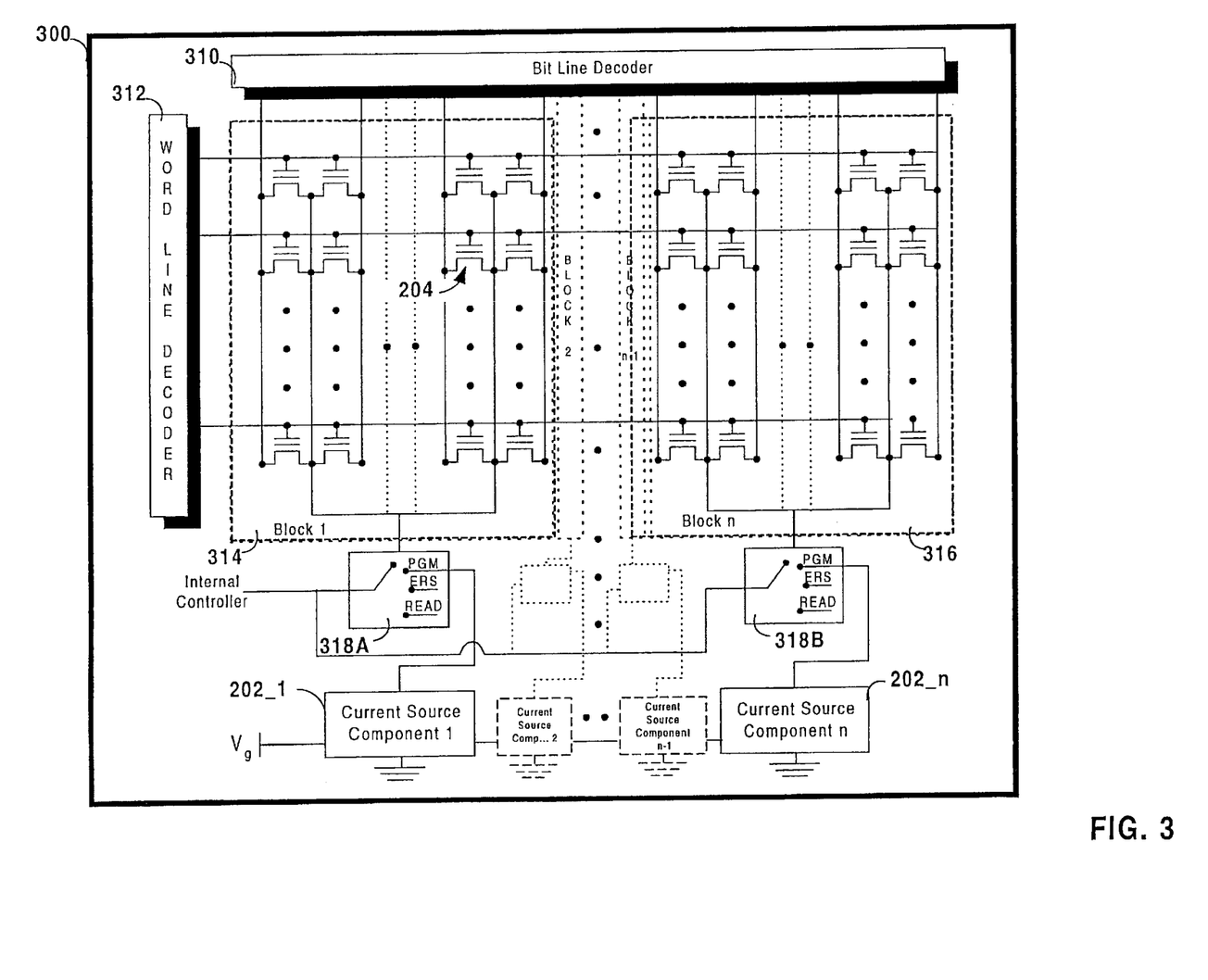
FIG. 3 is a hardware block diagram of an integrated circuit which implements a flash memory array utilizing the current source component for memory cell programming shown in FIG. 2.

FIG. 2 is a block diagram of the current source component according to the current invention. A representative floating gate memory cell 204 within a memory array is shown (See FIG. 3). That memory cell is switchably coupled via switch 206 to a current source component, which is, in turn, coupled to a voltage sink, e.g., an electrical ground. As is shown in FIG. 3, there may be multiple current source components within a memory array. In the embodiment shown the current source component includes a parallel combination of a dummy cell 220 and a resistor 222.

A dummy cell is a flash memory cell with the control and floating gate layers shorted together. In an embodiment of the invention, it is fabricated using substantially the same masks, dimensions and processes as the floating gate memory cell(s) 204 to which it is coupled, and thus shares both process dependent electrical characteristics with the cell being programmed. Process dependent characteristics include: channel width/length, oxide thickness and dopant type/density. Electrical characteristics include: resistance, capacitance, conductance, and inductance.

The gate of the dummy cell is coupled to a voltage Vg. Unlike the prior art, the voltage level of Vg need not be process dependent since the current source component(s) is itself process dependent. Vg applied to the dummy cell is fixed during the programming of a memory cell.

Figure 7A:
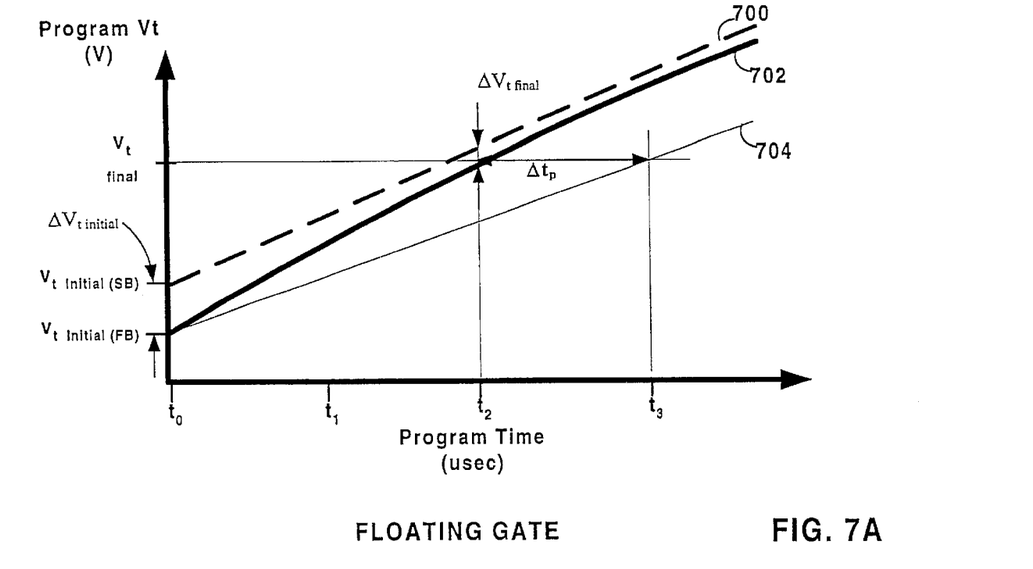
FIG. 7A is a graph showing the reduction in programming time and compaction of the voltage distribution which results from the source bias element of the current invention.
Figure 7B:
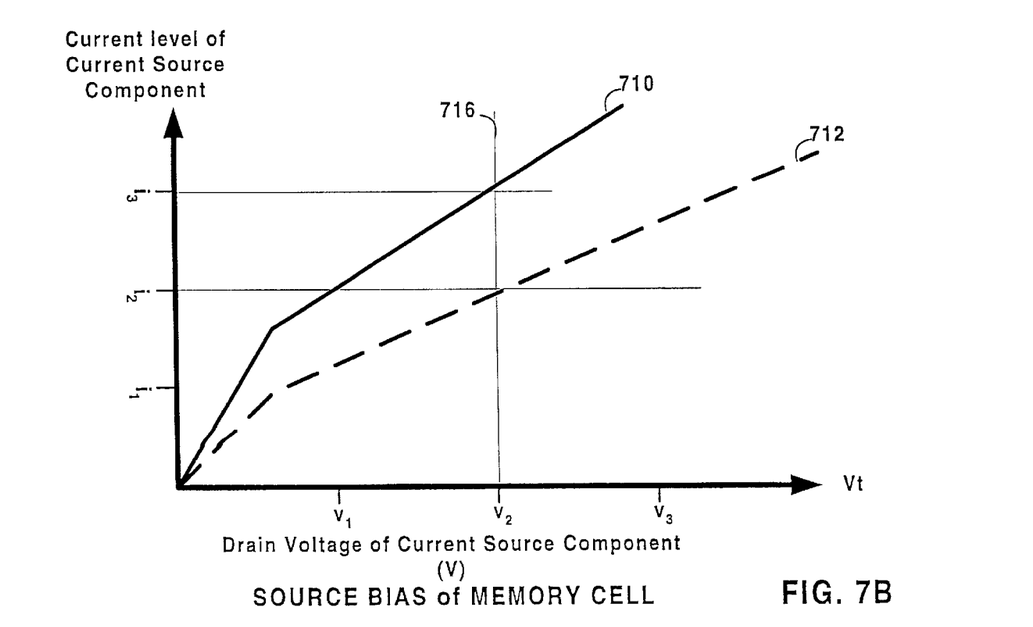
FIG. 7B is a graph showing the process dependent performance of the source bias element of the current invention.

There are several advantages to the embodiment shown in FIG. 2 over prior art approaches. First, no complicated source bias control is required since the current source component itself exhibits process dependent variations in electrical characteristics which mirror those of the floating gate transistor or memory cell to which it is switchably coupled. Second, the programming time is minimized by the series combination during programming of a process dependent current source component and memory cell, which itself exhibits process dependent electrical characteristics similar to those of the current source component. The series combination of two process dependent devices, i.e., representative memory cell 204 and dummy cell 220, assures that a fast program bit cell exhibiting low resistance and high conductivity will be coupled with a dummy cell having a similar characteristic. Conversely, a slow program bit cell exhibiting a higher resistance and a low conductivity will be coupled with a dummy cell exhibiting high resistance. Thus, the source current applied at the source of a memory array is inversely related to the reference flash cell's resistance as expressed by the following equation 2:

$$Is \; 1/Rcell, \qquad \text{Equation 2:}$$

where Rcell is the channel resistance of process tracking dummy cell. Thus, Vs(memory cell) is inversely proportional to programmed Vt of memory cell. Additionally, by varying the electrical conductivity of the current source component in direct proportion to the electrical conductivity of the memory cell to which it is coupled, it is possible to maintain both fast programming times as well as compact Vt distributions in the cells being programmed, as will be discussed in connection with the following FIGS. 7A–B.

FIG. 3 shows an integrated circuit memory module 300 on a semiconductor substrate. A memory array is shown with M rows and N columns of memory cells each including a floating gate transistor, e.g., floating gate transistor 204, which may, for example, be an EEPROM/EPROM. Word line decoder 312 and bit line decoder 310 couple to the M rows and N columns of memory cells to provide for reading and programming floating gate memory cells within a selected one of the M rows of the memory array. In the embodiment shown the N columns are separated into blocks 314–316 with the flash memory cells of a block coupled to a common source line.

The common source line of block 314 is coupled to an internal controller 318. The internal controller, in the embodiment shown, is a multi-poll switch which, during the programming phase of operation, couples the common source line from block 314 to an electrical sink, e.g., ground, via a current source component 322. The common source line of block 316 is coupled to an internal controller 320. During the programming phase of operations, the common source line of block 316 is coupled by the internal controller to the electrical sink via the current source component 324. The internal controller also makes appropriate connections of the common source line during both read and erase intervals to voltage sources, sense amps, etc. (not shown).

In the embodiment shown there is one current source component for each block of the memory array. In other embodiments of the invention there may be one current source component per column. The current source component contains an element with process dependent electrical characteristics similar to those exhibited by the cell being programmed. Each current source component is preferably located on the same portion of the memory module 300 as the memory block to which it couples, thus improving the correlation between its process dependent electrical characteristics and the electrical characteristics of the cell being programmed. The current source component contains elements similar to those set forth in FIG. 2 and the following FIGS. 4A–B. Because the current source component is distributed across the chip in general proximity to the memory block to which it is switchably coupled, it exhibits process variations similar to the cells to which it is coupled. The number of process tracking current source components are dependent upon the number of bits to be programmed simultaneously. Each current source component is connected to one selected cell in one bit line. In the embodiment shown, during programming each current source component is coupled via an associated internal controller and common source bit line to the source node of the floating gate transistor of the flash memory cell that is being programmed.

During programming, a common voltage $V_g$ is applied to the control gates of the active component, i.e., the dummy cell, within each of the current source components. In an embodiment of the invention, $V_g$ is fixed at one level during the programming of memory cells. In another embodiment, $V_g$ is substantially the same at any instant of time during programming across all the current source components 202_1–2 within a memory array. As will be obvious to those skilled in the art, the current invention may be practiced with equal advantage on other memory cell architectures including, for example, a virtual ground architecture, without departing from the scope of the invention.

Figure 4A:
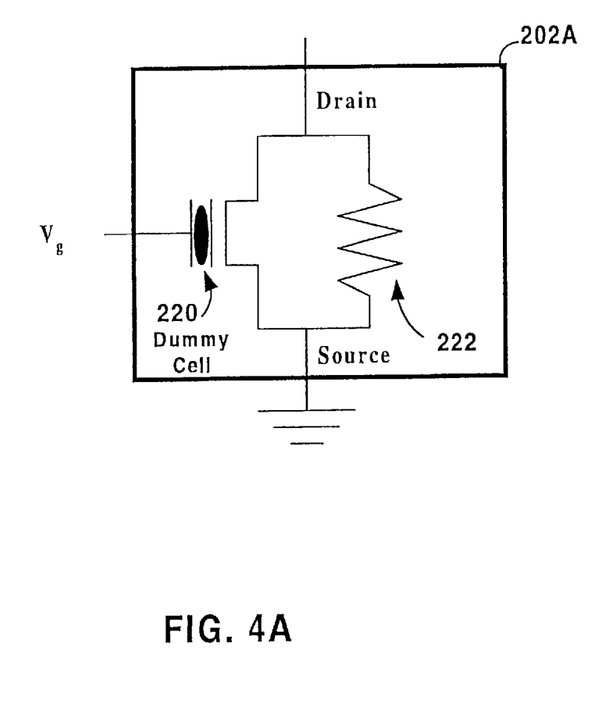
FIGS. 4A–B are hardware block diagrams showing alternate embodiments of a source bias element for programming memory cells.
Figure 4B:
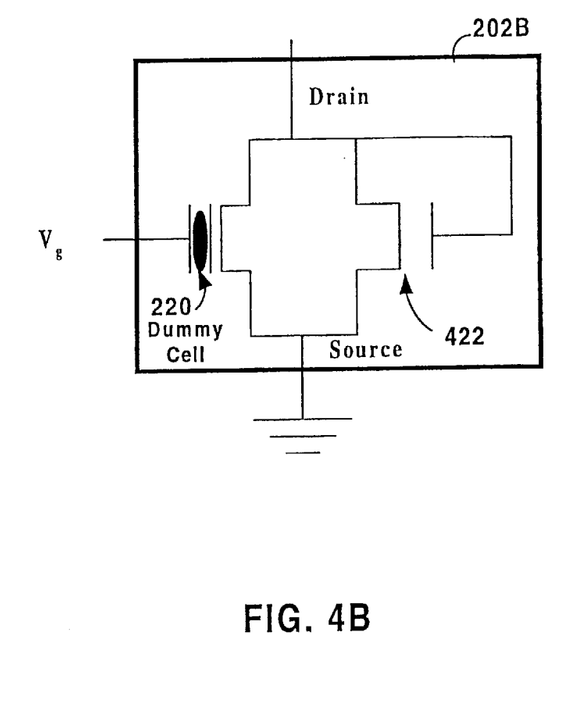

FIGS. 4A–B show alternate embodiments of the current source component 202A discussed above in connection with FIGS. 2–3. In FIG. 4A, the current source component includes a parallel combination of an active and a passive element, dummy cell 220 which is sensitive to the process variation in the electrical characteristics of the cells to which it is coupled, and a resistor 222, respectively. The resistor may be implemented in alternate embodiments as: a polysilicon resistor, a diffusion resistor or a Well resistor. The gate of the dummy cell is driven by voltage Vg.

In FIG. 4B, the parallel combination of two active elements, dummy cell 220 and a MOSFET with the gate shorted to the drain side, act as a diode. Either of these devices is suitable for use in the current invention and will reduce the threshold voltage distribution of the cells during programming. The channel length, channel width, gate oxide thickness, etc. of the dummy cell device 220 in FIGS. 4A–B substantially matches that of the flash memory cell to which it is coupled during programming. This allows fast bit cells to be injected with more charges to the floating gate during programming than slow bit cells.

Figure 5A:
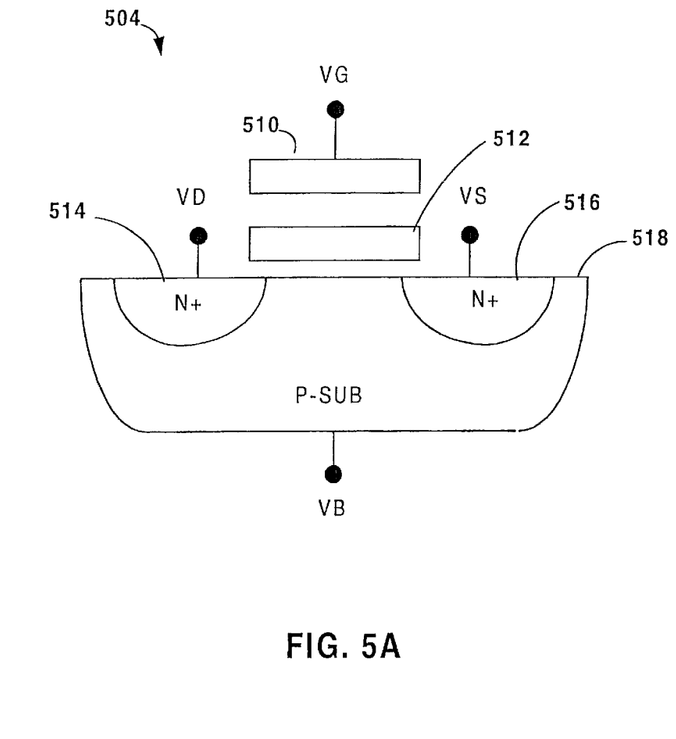
FIGS. 5A–B are cross-sectional elevation views of alternate embodiments of a flash memory cell for use in either the memory array or the current source component portions of the current invention.
Figure 5B:
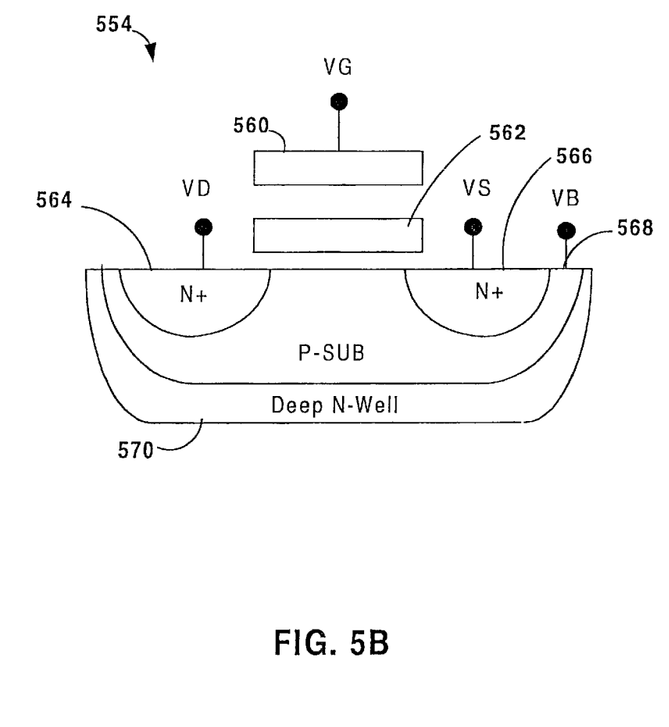

FIGS. 5A–B show alternate embodiments of the flash memory cell architecture suitable for use in an integrated circuit memory according to the current invention. FIG. 5A shows a flash memory cell 504 implemented as a non-split gate, N-channel type structure with P-well. The cell includes a control gate 510, a floating gate 512, bit line diffusions 514–516 forming, respectively, the drain and source of the device and a substrate 518. The cell is suitable for use in a memory array, such as that discussed above in connection with FIG. 3. In such an embodiment, each current source component would include a dummy cell fabricated in the same manner as cell 504, with the sole exception being that a conductive layer would be deposited between control gate 510 and floating gate 512, thus allowing the device to perform as a process dependent element of the current source component, in accordance with the current invention.

FIG. 5B shows a triple-well embodiment of a flash memory cell 554. The flash memory cell can also be fabricated by a triple-well process where the P-well is within a deep N-well, as shown in FIG. 5B. The drain/source region is n+ doped and may consist of n-dopant, which depends on the erasure method. That cell includes a control gate 560, a floating gate 562, drain and source bit lines, respectively, 564–566, a substrate well 568 and a deep N-well 570. When utilized in an integrated circuit memory architecture such as that shown in FIG. 3, the dummy cell within each current source component would be fabricated using the same parameters and processes as cell 554, with the sole exception being the deposition of a conductive, rather than insulative layer between the control gate 568 and the floating gate 562. This creates a process dependent dummy cell suitable for use in the current source component of the current invention. The triple-well device shown in FIG. 5B allows for low voltage applications when negative voltages are applied to the substrate. By applying a negative voltage at the substrate, the control gate voltage and the drain voltage can be reduced. For example, if a −3V bias is applied at substrate, the drain voltage can be reduced to be lower than 3V and the gate voltage is ramped from 3V to 6.5V, which is quite suitable for the low voltage application since the negative voltage provided by a pumping circuit would not be difficult to generate. The voltage reduction can reduce the chip area, since the area of charge pumping capacitance can be decreased and the fabrication steps for high voltage transistor can be reduced or simplified. For low voltage applications, the drain voltage can even be directly supplied from an external power supply instead of a pumping circuit.

Figure 6A:
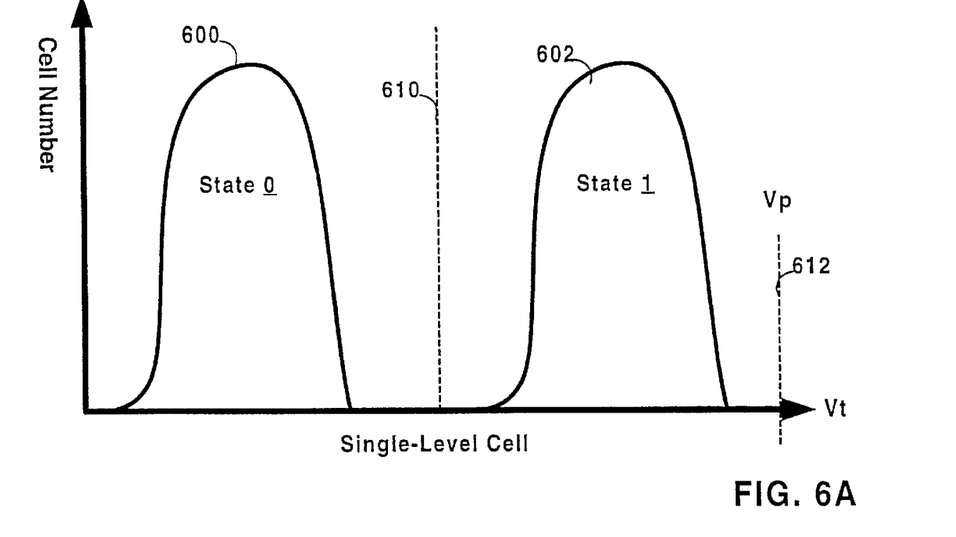
FIGS. 6A–B are graphs showing the voltage distributions for, respectively, a single level cell and a multilevel cell.
Figure 6B:
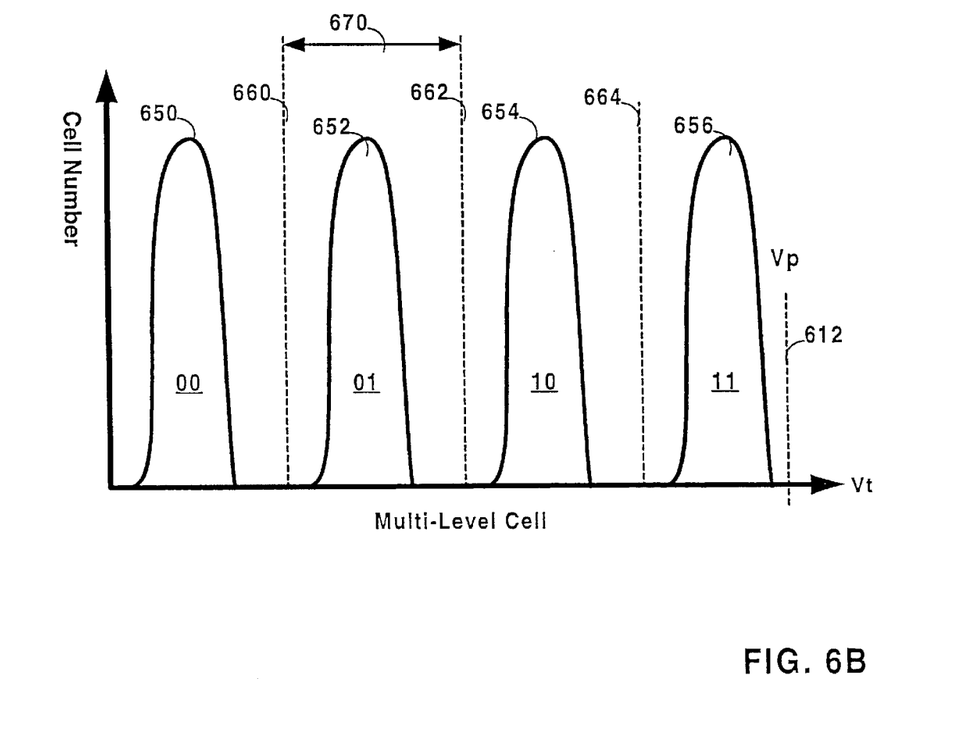

FIGS. 6A–B show the required Vt distributions for single level cells and multilevel cells (MLC), respectively. A single level cell has two distinct ranges of threshold voltages for programmed cells which are read as binary "0" or binary "1". A multilevel cell must hold four or more distinct ranges of threshold voltages. In FIG. 6B the multilevel cell holds four distinct voltage ranges which are read as their binary equivalents, i.e., "00,01,10,11". It can be seen clearly that the Vt bandwidth per state must become increasingly compact as the levels of memory that the cell supports increases. The broad voltage distributions shown in FIG. 6A may not be a problem for a cell storing one bit since there is no overlap of states. However, the same distributions in the multilevel implementation shown in FIG. 6B would be a problem, since overlap of distributions would result with the consequence that the state of a cell could not be distinguished without error. Thus, although the current source component of the current invention may be used with advantage in either single/multilevel cells, its use is particularly advantageous in multilevel cells.

In the single level cell shown in FIG. 6A, two threshold voltage distributions 600–602 are shown. The area under each of these curves represents the distribution of threshold voltages for programmed cells within the memory array. Threshold voltages 600 lie below intermediate voltage 610 and are thus interpreted as storing binary "0". Threshold voltages 602 lie above intermediate voltage 610, and below peak voltage 612, and are thus interpreted as storing binary "1". The voltage distributions 600–602 are rather broad, reflecting process variations between cells and the absence of the current source component of the current invention to counteract those process variations.

In order to implement multilevel cells, it is necessary to reduce the process dependent voltage distribution of the cells being programmed. The current source component of the current invention provides such a capability.

In FIG. 6B, three intermediate voltage levels 660–664 and four threshold voltage states 650–656 are shown. Each of the threshold voltage distribution's 650–656 has a much narrower distribution profile than those shown in FIG. 6A. The voltage states 650–656 are interpreted as storing the binary equivalent of "00, 01, 10, 11" respectively. The voltage range 670 separating any intermediate states, for example, 660–662, is narrower than the corresponding range for a single level device. As technology advances and lower power levels are implemented, further improvements in the threshold voltage compaction are required. The current source component of the current invention provides such capabilities.

FIG. 7A is a graph of program voltage Vt versus program time for fast and slow bit memory cells. The program voltage for a representative slow program bit cell is shown on line 700. The program voltage for a representative fast program bit cell programmed with the process tracking current source component of the current invention is shown on line 702. In the example shown, a fixed drain voltage, for example, 6V and a ramped gate voltage, for example, 6V–9.5V is applied over a programming interval, for example, 100us to the memory cell to be programmed. The fast and slow bit memory cells begin at different starting points, i.e., different initial values for Vt. This results from the fact that slow bit memory cells are likely to be found at the high voltage side of the erased threshold voltage distribution, since they typically require more time to erase, while fast bits are typically found at the low voltage side of the erased threshold voltage distribution, since they require less time to erase. Thus, at time $t_0$, the fast bit cell has an erased threshold voltage $Vt_{initial(FB)}$ and the slow bit cell has an erased threshold voltage $Vt_{initial(SB)}$. The erased threshold voltage of the slow bit cell is greater than that of the fast bit cell for the reasons discussed above. The initial threshold voltage difference between the fast and slow bit cell is $\Delta Vt_{initial}$. The target program voltage for the fast and slow bit cell is $Vt_{final}$.

The programming objectives are twofold: to minimize both the average programming time for the fast and slow bit cell and the voltage range $\Delta Vt_{final}$ between the fast and slow bit cell after programming. Satisfaction of the first objective provides faster operation of a floating gate memory, while satisfaction of the second objective permits multilevel operation of the floating gate memory. Both objectives are satisfied with the current invention. The current source component is process sensitive; thus allowing greater current flow through the fast program bit cell per unit of time than the slow program bit cell. Thus, more charges per unit of time are injected into the fast bit floating gate than is the case for the slow bit floating gate, which results in a reduction of the initial threshold voltage difference between fast and slow bits during programming. During programming, the initial threshold voltage difference $\Delta Vt_{initial}$ is reduced to a range $\Delta Vt_{final}$ about the target program voltage $Vt_{final}$. Thus, the process variable current source component of the current invention reduces the threshold voltage distribution range of the fast and slow bit cells about the target program voltage during programming.

The time required to program a memory is defined by the time required by whichever of the cells (fast/slow program bit cells) within the array requires the greatest amount of time to reach the target program voltage $Vt_{final}$. Although the fast bit cells program faster, they require more time to reach the target voltage because they typically start from an erased voltage on the low voltage side of the erased voltage distribution when compared with the slow bit cells. Line 704 shows the performance of the representative fast bit cell under the same programming conditions as line 702, with an important difference. The fast bit cell whose performance is conveyed by line 704 is coupled to a current source component lacking process tracking characteristics of the current invention. Thus, that cell is receiving the same current as is supplied to the slow bit cell whose performance is shown on line 700. Under constant current conditions, the slow bit cell would require much longer, i.e. $t_2+\Delta tp$ to reach the target program voltage $Vt_{final}$, thus extending the overall time to program the floating gate memory array. Instead, by using the current source component of the current invention which applies more program current to fast bit cells, both fast and slow program bit cells reach the program voltage at time $t_2$. Thus, the process variable current source component of the current invention reduces the time for the fast bit cells to reach the target program voltage by supplying more current to the fast program bit cells than to their slow bit counterparts.

FIG. 7B is a graph of drain current versus drain voltage on the current source component of the current invention. Lines 710–712 show, respectively, the process dependent I-V characteristics for the current source component coupled to, respectively, fast program bit cells and slow program bit cells. Line 716 shows an arbitrary voltage level, e.g., $v_2$ such as would be maintained at node 212 (see FIG. 2) during operation of the current invention. Thus, in the example shown, a fast program bit cell is programmed at a higher current level, e.g., $i_3$ than the slow program bit cell for which the programming current level is lower, e.g., $i_2$. This result is affected by coupling low-resistance fast programming bits to a process dependent current source with a dummy cell having similar electrical characteristics. Conversely, high resistance slow program bit cells are coupled to their high resistance dummy cell counterparts during the programming of the cell. Thus, compact threshold voltage distribution, as well as reduced programming times, are affected by the current invention.

Figure 8A:
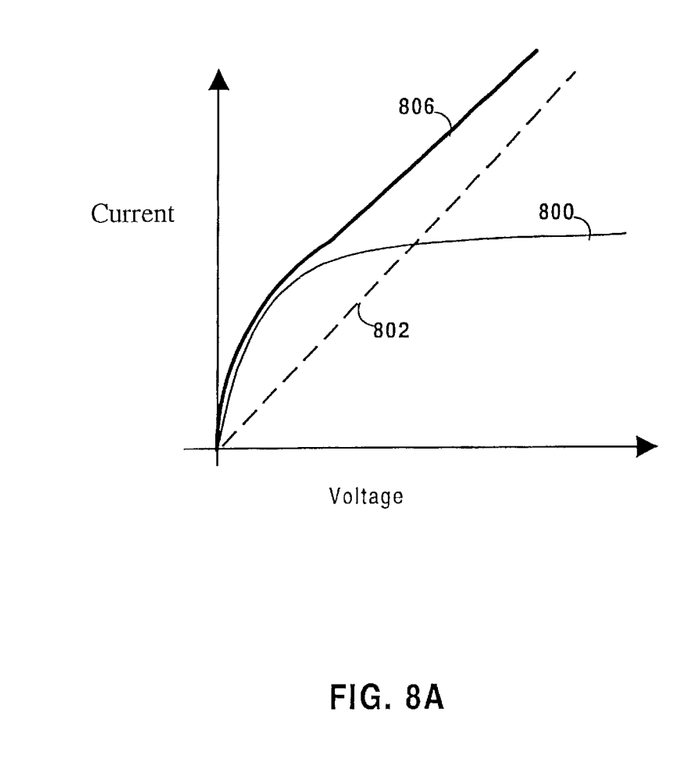
FIGS. 8A–B are graphs showing the individual performance characteristics of selected elements within the current source component of the current invention.
Figure 8B:
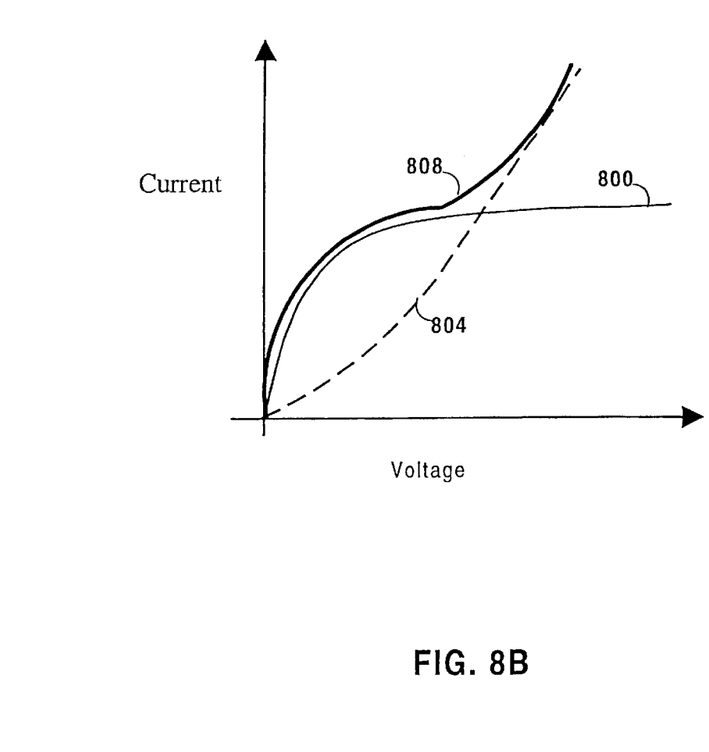

FIGS. 8A–B show the I-V profiles of the current source components discussed above in connection with, respectively, FIGS. 4A–B. FIG. 8A shows the I-V characteristics of: resistor 222 on line 802, dummy cell 220 on line 800, and of the parallel combination of resistor and dummy cell on line 806.

FIG. 8B is a graph showing the I-V characteristics of: dummy cell 220 on line 800, diode 422 on line 804, and of the parallel combination of dummy cell and diode on line 808. The parallel combination of either the resistor/diode with the dummy cell 220 modifies the I-V curve of the dummy cell and allows the current source to perform in a process dependent manner beyond the saturation range of the dummy cell.

The voltage applied on the gate electrode of the dummy cell transistor is selected to provide a predetermined current level (~20uA to 50uA), for example. The dummy cell transistor is coupled with a diode or with a resistor in parallel to produce the desired I-V curve. The resistor or the diode is used to modify the I-V curve slope of the dummy cell transistor to keep the programming current constant. Resistor values may range from 20 Kohms to 200 Kohms. Though the I-V curve for dummy cell transistor in parallel with a resistor shows somewhat of a difference as compared to a parallel combination with a diode, the characteristics that supply lower current to slow program bits and higher current to fast program bits are the same and can effectively reduce the variation in threshold voltages after programming.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. Circuitry for programming a floating gate transistor, and the floating gate transistor including gate, drain and source nodes, and the circuitry for programming comprising:
   a current source component coupled in series between the floating gate transistor and an electrical sink during a programming interval, and the current source component including an electrical characteristic substantially matching the electrical characteristic of the floating gate transistor.

2. The circuitry for programming a floating gate transistor of claim 1, wherein the electrical characteristic of the current source component includes at least one of: resistance, capacitance, conductance, and inductance.

3. The circuitry for programming a floating gate transistor of claim 1, wherein the current source component further comprises a process dependent electrical characteristic substantially matching the process dependent electrical characteristic of the floating gate transistor.

4. The circuitry for programming a floating gate transistor of claim 3, wherein the process dependent electrical characteristic of the current source component includes at least one of: channel width, channel length, oxide thickness, dopant type and dopant density.

5. The circuitry for programming a floating gate transistor of claim 1, wherein the current source component further comprises;
   a dummy cell including gate, drain and source nodes, and the drain node coupled to the source node of the floating gate transistor, the source node coupled to the electrical sink, the gate coupled to a voltage source, and the dummy cell fabricated utilizing processes substantially matching the fabrication processes utilized for the floating gate transistor.

6. The circuitry for programming a floating gate transistor of claim 5, wherein the current source component further comprises;
   a resistor coupled in parallel with the dummy cell.

7. The circuitry for programming a floating gate transistor of claim 5, wherein the current source component further comprises;
   a diode coupled in parallel with the dummy cell.

8. The circuitry for programming a floating gate transistor of claim 7, wherein the diode further comprises;
   a MOSFET with the gate shorted to the drain side to act as a diode.

9. The circuitry for programming a floating gate transistor of claim 1, wherein the current source component further comprises;
   a dummy cell including gate, drain and source nodes, and the drain node coupled to the source node of the floating gate transistor, the source node coupled to the electrical sink, and the gate coupled to a voltage source, and the dummy cell fabricated with dimensions substantially matching the dimensions of the floating gate transistor.

10. The circuitry for programming a floating gate transistor of claim 9, wherein the current source component further comprises;
    a resistor coupled in parallel with the dummy cell.

11. The circuitry for programming a floating gate transistor of claim 9, wherein the current source component further comprises;
    a diode coupled in parallel with the dummy cell.

12. The circuitry for programming a floating gate transistor of claim 11, wherein the diode further comprises;
    a MOSFET with the gate shorted to the drain side to act as a diode.

13. The circuitry for programming a floating gate transistor of claim 1, wherein said current source component couples in series between the floating gate transistor and the electrical sink only during a programming interval.

14. The circuitry for programming a floating gate transistor of claim 1, further comprising;
    a switch switchably coupling the current source component to the floating gate transistor only during the programming interval.

15. An integrated circuit memory module on a semiconductor substrate comprising;

an array of floating gate memory cells arranged in M rows and N columns and each cell including a floating gate transistor and the floating gate transistor including gate, drain and source nodes;

decoders coupled to the M rows and N columns of memory cells to provide for reading and programming floating gate memory cells within a selected one of the M rows of the memory array; and a plurality of current source components each coupled in series between an electrical sink and a corresponding one of the floating gate memory cells within the selected one of the M rows during a programming interval, and each of the plurality of current source components including an electrical characteristic substantially matching the electrical characteristic of the corresponding one of the floating gate memory cells to be programmed.

16. The integrated circuit memory module of claim 15, wherein the array of M rows and N columns of floating gate memory cells are arranged in blocks with the source node of each floating gate transistor within the memory cells of each block coupled to a common source line; and wherein further the plurality of current source components each couple to the common source line of a corresponding one of the blocks.

17. The integrated circuit memory module of claim 15, wherein the electrical characteristic of each of the plurality of current source components includes at least one of: resistance, capacitance, conductance, and inductance.

18. The integrated circuit memory module of claim 15, wherein the plurality of current source components each further comprise a process dependent electrical characteristic substantially matching the process dependent electrical characteristic of the corresponding one of the floating gate memory cells.

19. The integrated circuit memory module of claim 18, wherein the process dependent electrical characteristic of each of the plurality of current source components includes at least one of: channel width, channel length, oxide thickness, dopant type and dopant density.

20. The integrated circuit memory module of claim 15, wherein each of the plurality of current source components further comprises;

a dummy cell including gate, drain, and source nodes, and the drain node coupled to the source node of the floating gate transistor within the corresponding one of the floating gate memory cells, the source node coupled to the electrical sink, the gate coupled to a voltage source, and the dummy cell fabricated utilizing processes substantially matching the fabrication processes utilized for the corresponding one of the floating gate memory cells.

21. The integrated circuit memory module of claim 20, wherein each of the plurality of current source components further comprises;

a resistor coupled in parallel with the dummy cell.

22. The integrated circuit memory module of claim 20, wherein each of the plurality of current source components further comprises;

a diode coupled in parallel with the dummy cell.

23. The integrated circuit memory module of claim 22, wherein the diode further comprises:

a MOSFET with the gate shorted to the drain side to act as a diode.

24. The integrated circuit memory module of claim 15, wherein each of the plurality of current source components further comprises;

a dummy cell including gate, drain and source nodes, and the drain node coupled to the source node of the floating gate transistor, the source node coupled to the electrical sink, the gate coupled to a voltage source, and the dummy cell fabricated with dimensions substantially matching the dimensions of the floating gate transistor.

25. The integrated circuit memory module of claim 24, wherein each of the plurality of current source components further comprises;

a resistor coupled in parallel with the dummy cell.

26. The integrated circuit memory module of claim 24, wherein each of the plurality of current source components further comprises;

a diode coupled in parallel with the dummy cell.

27. The integrated circuit memory module of claim 26, wherein the diode further comprises:

a MOSFET with the gate shorted to the drain side to act as a diode.

28. The integrated circuit memory module of claim 15, wherein each of the plurality of current source components couples in series between the floating gate transistor and the electrical sink only during a programming interval.

29. The integrated circuit memory module of claim 15, further comprising:

a plurality of switches each associated with a corresponding one of the plurality of current source components and each of the plurality of switches switchably coupling the corresponding one of the plurality of current source components to the corresponding one of the floating gate memory cells only during the programming interval.

* * * * *